(12) United States Patent
Hinton et al.

(10) Patent No.: US 9,374,107 B1
(45) Date of Patent: Jun. 21, 2016

(54) TIME SHARED PROTOGRAPH LDPC DECODER

(71) Applicant: L-3 COMMUNICATIONS CORP., New York, NY (US)

(72) Inventors: Ryan W. Hinton, Farmington, UT (US); Joshua D. Gunn, Edra, UT (US)

(73) Assignee: L-3 Communications Corp., New York, NY (US)

( * ) Notice: Subject to any disclaimer, the term of this patent is extended or adjusted under 35 U.S.C. 154(b) by 147 days.

(21) Appl. No.: 14/278,749

(22) Filed: May 15, 2014

(51) Int. Cl.
*H03M 13/11* (2006.01)

(52) U.S. Cl.
CPC ................................ *H03M 13/1105* (2013.01)

(58) Field of Classification Search
CPC ............ H03M 13/036; H03M 13/116; H03M 13/1197; H03M 13/1137; H04L 1/005; H04L 1/0057
USPC .................................................. 714/752, 758
See application file for complete search history.

(56) References Cited

U.S. PATENT DOCUMENTS

| | | | |
|---|---|---|---|
| 8,266,493 B1 | 9/2012 | Abbaszadeh et al. | |
| 2005/0149844 A1* | 7/2005 | Tran .................. | H03M 13/1117 714/800 |
| 2006/0123318 A1* | 6/2006 | Kim .................. | H03M 13/1114 714/758 |
| 2006/0294445 A1* | 12/2006 | Divsalar ............ | H03M 13/1197 714/752 |
| 2011/0307756 A1* | 12/2011 | Nguyen .............. | H03M 13/036 714/752 |

OTHER PUBLICATIONS

Mansour, et al., "High-Throughput LDPC Decoders," IEEE Transactions on Very Large Scale Integration Systems, Dec. 2003, vol. 11, No. 6, pp. 976-996.
Divsalar, et al., "Constructing LDPC Codes from Simple Loop-Free Encoding Modules," IEEE International Conference on Communications, May 2005, vol. 1, pp. 658-662.
Divsalar, et al., "Protograph Based LDPC Codes with Minimum Distance Linerarly Growing with Block Size," IEEE Globecom 2005, Dec. 2005, vol. 3, pp. 1152-1156.
Costello, et al., "A Comparison of ARA- and Protograph-Based LDPC Block and Convolutional Codes," 2007 Information Theory and Applications Workshop, Jan.-Feb. 2007, pp. 111-119.

* cited by examiner

*Primary Examiner* — David Ton
(74) *Attorney, Agent, or Firm* — Workman Nydegger

(57) ABSTRACT

An LDPC decoder includes a check node processor. The check node processor is configured to implement an n-degree check node, where n is a predetermined number. The degree of a check node is the number of edges coupled to the check node. The LDPC decoder also includes a plurality of n time division multiplexers coupled to the check node processor to couple different edge connection input values to the check node processor at different times so as to allow the check node processor to be time division multiplexed for use in implementing different check nodes with the same check node processor. Each of the multiplexers is configured to provide no more than one edge connection input value to the check node processor at any given time. Each edge connection is used to implement an edge into a check node.

20 Claims, 10 Drawing Sheets

TIME SHARED PROTOGRAPH LDPC DECODER

BACKGROUND

Background and Relevant Art

Digital data communications are ubiquitous in today's modern society. Such communication can take one or more of a number of different forms. For example, communications may take place at the micro-level when binary bits are transmitted across microscopic circuits within an integrated circuit. At the other extreme, communication may travel long distances by use of satellite or other long distance transmission systems. Indeed communications are regularly undertaken with machines and individuals around the world and beyond.

To accomplish such communications requires the use of one or more transmission systems and associated mediums. Such mediums may be, for example, integrated circuit paths, wires, optical fibers, or even over the air. Virtually every communication system has some limitations associated with it. In particular, any given communication medium may attenuate digital signals transmitted across it. Additionally, the mediums may be susceptible to noise causing errors to be introduced into a digital signal. Indeed, small noise sources from molecular vibrations to large intentional jamming noise sources can perturb digital signals to change them from the form in which they were originally transmitted.

There are several ways of dealing with such noise including regulating the speed at which signals are sent, shielding the medium from noise, filtering the signal, etc. However, inevitably, errors will be introduced into a digital signal. This will result in an inability to detect the value of one or more bits in a signal, or one or more bits will be "flipped" such that the interpretation of them is exactly the opposite of what it should be.

To address these issues, many modern communication systems use so-called error detection and error correction schemes. In essence, extra bits are transmitted with a digital communication that can be used at a receiving system to detect if an error has occurred and, in many cases, to apply a probabilistic fix to correct any errors.

One particularly effective means for performing error correction is using low density parity-check (LDPC) block codes. LDPC codes are defined using a sparse-parity check matrix. Such a matrix is typically a randomly generated matrix that complies with certain constraints depending on the type of LDPC algorithms being used.

At a transmitter side, a message, comprising a set of bits, is transformed into a codeword, comprising a different set of bits, by using the sparse-parity check matrix. The codeword is then transmitted across a medium to a receiver. During transmission, the codeword may be affected by noise on the channel. This results in a noisy codeword eventually being received by the receiver. The noisy codeword may have errors as compared to the original codeword.

At the receiver, a protograph based decoder, also based on the sparse-parity check matrix, operates on the noisy codeword to determine if the codeword has errors and to determine, probabalistically, the correct codeword. The protograph based decoder can be envisioned as a Tanner graph that has variable nodes (v nodes) coupled to check nodes (c nodes) through edges. Various check node messages are sent and received as the code word is applied to the v nodes (with one bit at each v node). Various combinations of the bits of the received noisy codeword are input to the c nodes of the tanner graph through the edges. Each c node calculates, based on the bits received, what it believes that the bits should be and transmits back to each v-node that it is coupled to it through an edge, a believed bit.

A given v node may be coupled to multiple c nodes and thus may receive conflicting information about what different c-nodes believe the bit at the v node should be. Therefore, the v node computes a new belief, and transmits this back to the c nodes to which it is connected. The tanner graph is recursive such that this process iterates in this fashion until the tanner graph settles on a codeword or until a certain number of iterations have been performed.

To increase the efficiency at which this process occurs, a protograph may be "doubly lifted". This means that a copy and permute operation is performed on the protograph to obtain a larger graph. In particular, the protograph is copied and the endpoints of the edges are permuted to form a larger graph. Doubly lifting performs an additional copy and permute operation on the previously copied and permuted protograph. This doubly-lifted protograph exhibits additional structure that eases description and implementation of efficient encoders and decoders.

However, previous protograph decoders based on protograph decoder architectures do not scale down in size and throughput. Each protograph check node requires a separate belief propagation processor, also referred to herein as a check-node processor (CNP).

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes a method for time-sharing LDPC decoding hardware. The method includes identifying one or more subsets of check nodes for an LDPC system. Each check node in the subsets of check nodes is of a particular degree. The degree of a given check node is the number of edges coupled to the given check node. For a given subset of check nodes, the method includes identifying the highest degree of any node in the subset of check nodes. The method further includes providing a check node processor configured to implement a check node of at least the identified highest degree by having a sufficient number of check node processor inputs. The check node processor is configured to implement each of the check nodes in the given subset, by different sets of edge connection input values being time division multiplexed resulting in each set of edge connection input values in the different sets being provided to the check node processor inputs at different times. At a given time, a given set of edge connection input values are used to implement edges coupled to a check node.

Another embodiment is directed to an LDPC decoder. The LDPC decoder includes a check node processor. The check node processor is configured to implement an n-degree check node, with n being a predetermined number. The degree of a check node is the number of edges coupled to the check node. The LDPC decoder also includes a plurality of n time division multiplexers coupled to the check node processor to couple different edge connection input values to the check node processor at different times so as to allow the check node processor to be time division multiplexed for use in implementing different check nodes with the same check node processor. Each of the multiplexers is configured to provide no more than one edge connection input value to the check node processor at any given time. Each edge connection is used to implement an edge into a check node.

In yet another embodiment, a method of decoding an LDPC codeword is illustrated. The method includes receiving a noisy LDPC codeword. At a first time, a first portion of the LDPC codeword is applied to a first n-degree check node by applying a first set of edge connection input values to a check node processor configured to implement an n-degree check node. In this case, "n" is a predetermined number, and the degree of a check node is the number of edges coupled to the check node. At a second time, a second portion of the LDPC codeword is applied to a second n-degree check node by applying a second set of edge connection input values to the check node processor.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

The application is generally directed to implementing a system whereby check node processors (CNPs) can be time shared. In particular time sharing of a processor can be based on the degree of check nodes, such that check nodes with the same degree (i.e., the same number of edges coming into them) can be implemented using the same physical check node processor. Thus, check nodes can be grouped into sets by degree, and a single CNP can be used to implement the check nodes in a given set, based on the degree of the nodes in the set. In an alternative embodiment, a check node processor with a given-degree can be used to implement any check nodes with the same or lower degree. However, efficiencies can be obtained by grouping same degree sized check nodes. The processor can be time shared to implement different check nodes of a protograph at different times.

Due to the time sharing of a processor, additional hardware efficiencies may be obtained. In particular, several shift registers may be replaced by a single RAM. Specifically, each check node processor has storage for shifting bits into the check node processor. Previously, the most cost-effective way to supply this storage was by coupling a shift register to each processor. When a single processor is used for several check nodes, then a single storage may be used for several check nodes as well. This can help reduce the cost per bit of storage, as Random Access Memory (RAM) is generally cheaper than shift registers in a cost per bit comparison.

Details are now illustrated. Embodiments of the invention are directed to time sharing hardware processors in protograph-based Low-density Parity-check (LDPC) decoders. Embodiments may be particularly useful in implementing systems based on Quasi Cyclic (QC) LDPC codes that are 'doubly-lifted' protograph codes. However, embodiments may be equally efficiently implemented with codes in which sufficient major rows in the parity check matrix of a code have the same degree.

Previous decoders based on protograph decoder architectures do not scale down in size and throughput. Rather, each protograph check node required a separate check-node processor (CNP). In contrast, embodiments herein allow for time sharing of similar CNPs by exploiting further code structure.

Figure 1:
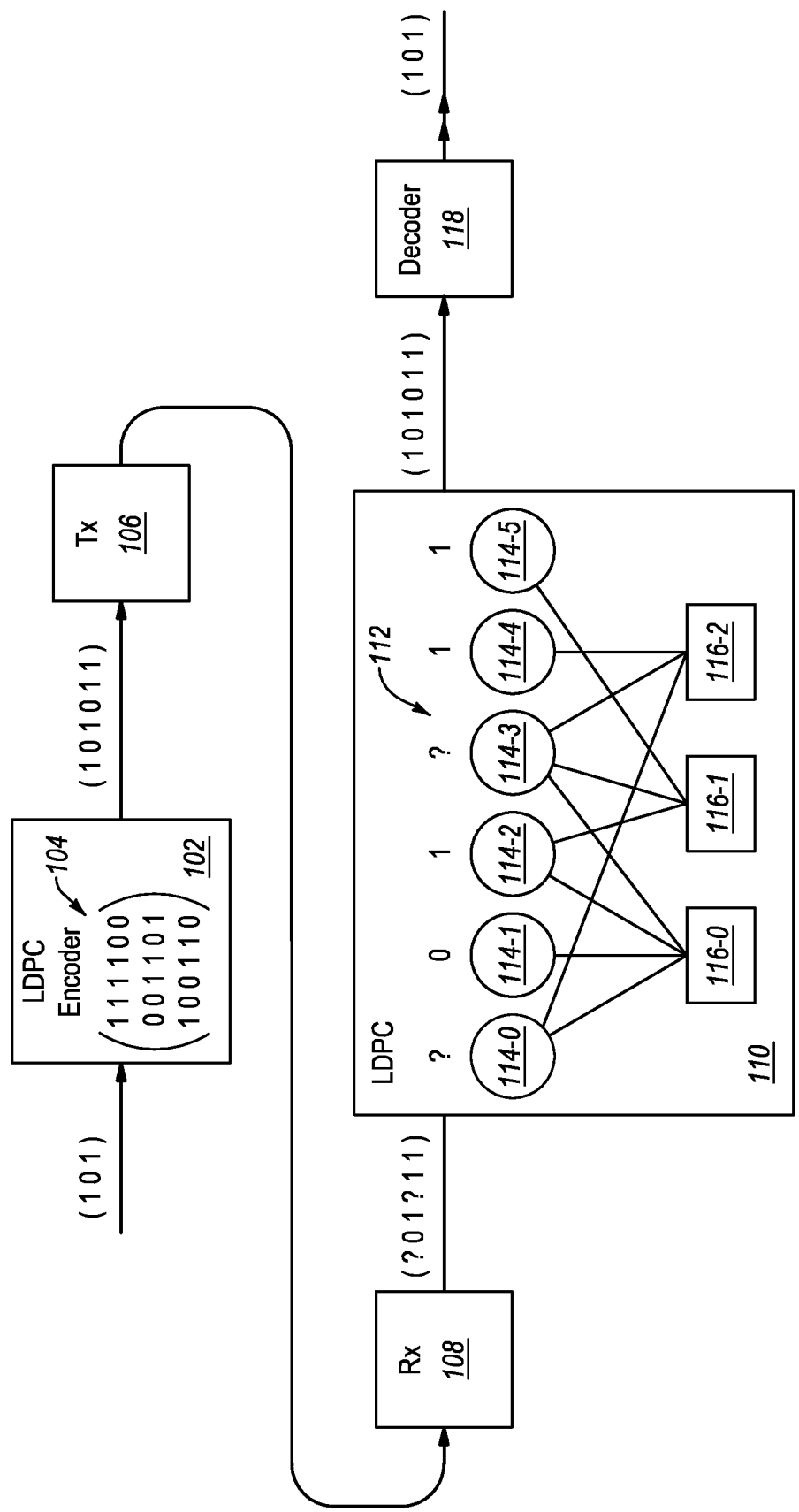
FIG. 1 illustrates an LDPC digital communication system.

Reference is now made to FIG. 1, which illustrates a simple communication system. The communication system includes a portion for encoding and sending data and a portion for receiving, correcting, and decoding data. In particular, FIG. 1 illustrates a string of data (in this example, the string "101" is illustrated) being input into an LDPC encoder 102 that encodes input data based on a sparse-parity check matrix 104. The encoder 102 outputs a codeword (in this example, the codeword output from the encoder 102 based on the string "101" is "101011"). A transmission signal is then modulated using the codeword at the transmitter 106 and the modulated signal is transmitted on a transmission medium, such as over the air, fibre-optics, wire, etc. Noise may be introduced into the transmission medium causing the modulated signal representing the codeword to be degraded.

At the receive portion of the communication system, a receiver 108 receives the degraded modulated signal and converts the signal to a noisy codeword. In this example, the noisy codeord is represented as (?01?11) meaning that two of the bits of the codeword cannot be determined. The noisy codeword is input into a protograph based decoder 110. The protograph based decoder 110 uses a protograph 112 that is based on the sparse-parity check matrix 104 to correct the noisy codeword (i.e. ?01?11) and recover the original codeword (i.e. 101011).

The illustrated protograph 112 has six value nodes (one for each bit of the codeword) 114-0, 114-1, 114-2, 114-3, 114-4, 114-5 and three check nodes 116-0, 116-1, and 116-2. Check node 116-0 is a fourth degree node being connected to four value nodes 114-0, 114-1, 114-2, and 114-3 through edges.

Check node 116-1 is a third degree node being connected to three value nodes 114-2, 114-3 and 114-5 through edges. Check node 116-2 is also a third degree node being connected to three value nodes 114-0, 114-3 and 114-4.

The recovered codeword is fed to a decoder 118 which recovers the original string of data (i.e., 101). Notably, the decoder 118 may be implemented as part of the protograph based decoder 110, but is illustrated herein separately so that implementation details of the protograph based decoder 110 can be more fully understood.

Figure 2:
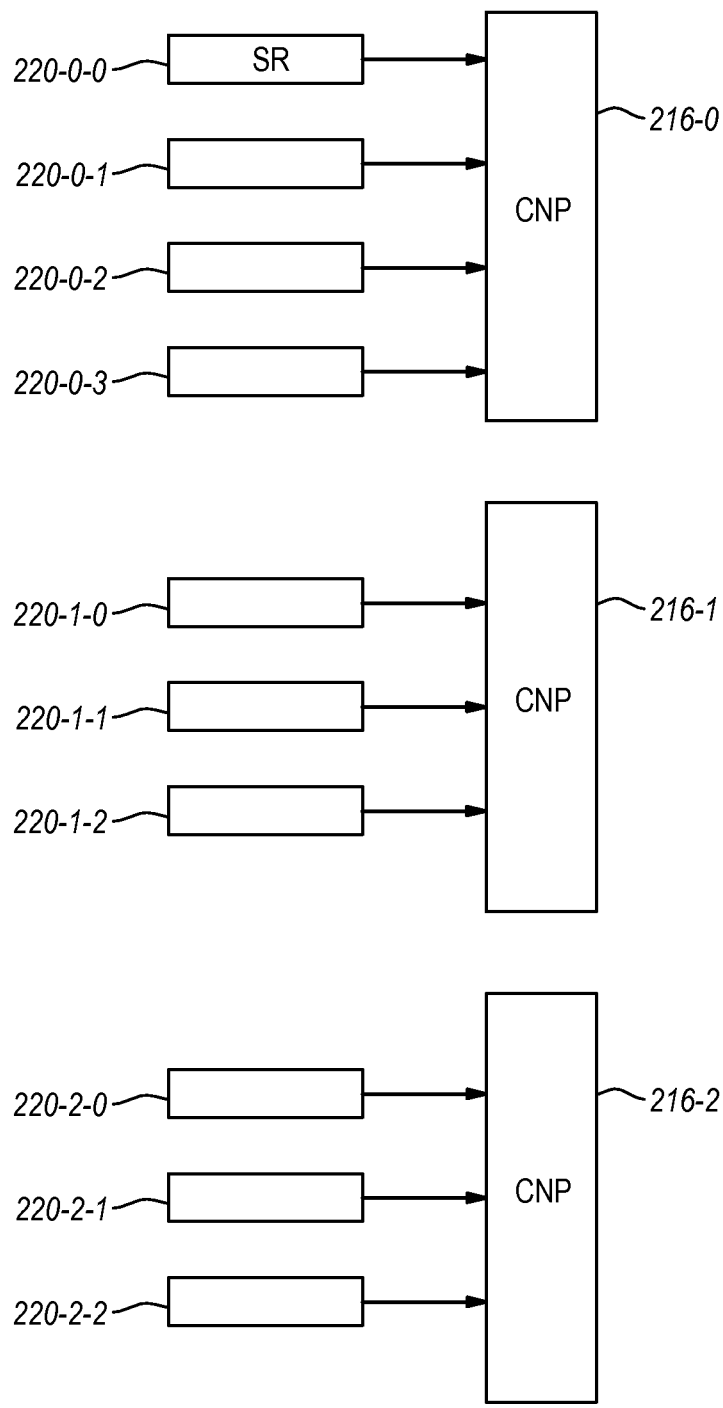
FIG. 2 illustrates a set of check node processors and associated registers.

FIG. 2 illustrates an example, of how the check nodes 116-0, 116-1 and 116-2 of the protograph based decoder 110 might traditionally be implemented. In particular, for each of the check nodes 116-0, 116-1, and 116-2 of the protograph based decoder 110, a hardware check node processor 216-0, 216-1, and 216-2 respectively is utilized. In the illustrated example, the CNP 216-0 is coupled to four shift registers 220-0-0, 220-0-1, 220-0-2, and 220-0-3 to shift bits into the CNP 216-0 as the CNP 216-0 is used to implement the fourth degree check node 116-0. The CNP 216-1 is coupled to three shift registers 220-1-0, 220-1-1, and 220-1-2 to shift bits into the CNP 216-1 as the CNP 216-1 is used to implement the third degree check node 116-1. The CNP 216-2 is coupled to three shift registers 220-2-0, 220-2-1, and 220-2-2 to shift bits into the CNP 216-1 as the CNP 216-1 is used to implement the third degree check node 116-1.

Figure 3:
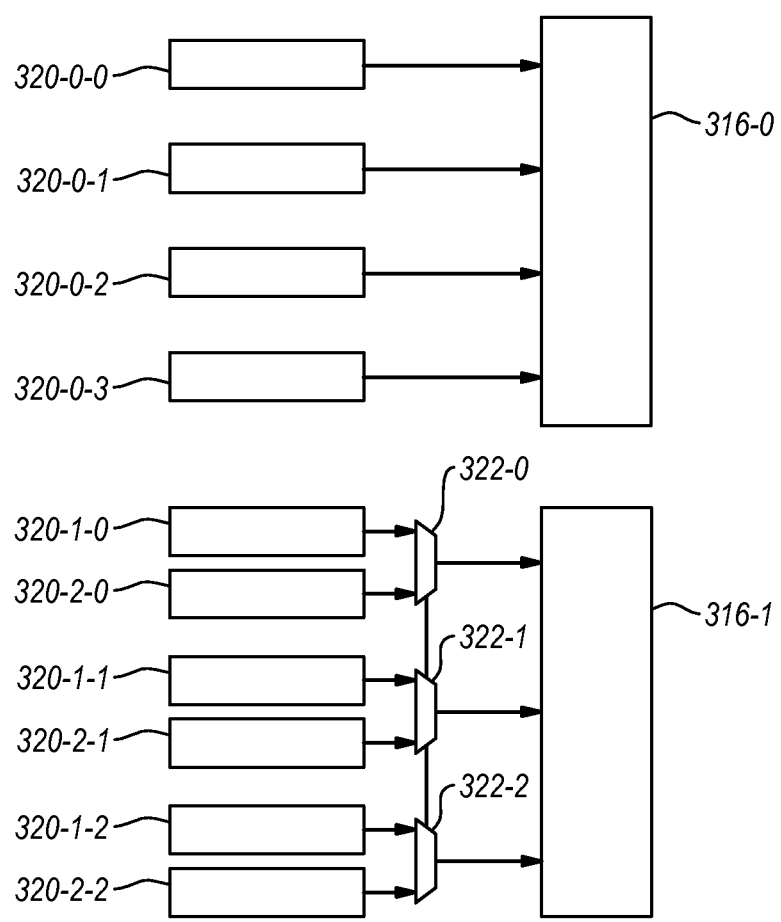
FIG. 3 illustrates sharing a check node processor.

However, in one embodiment, a single CNP may be used to implement all check nodes with the same degree for the protograph based decoder 110. Such an example is illustrated in FIG. 3. In particular, FIG. 3 illustrates two CNPs being used, CNP 316-0 which has four inputs and is used to implement the fourth degree check node 116-0 and CNP 316-1, which has three inputs and is used to implement the two third degree check nodes 116-1 and 116-2. In this example, CNP 316-0 is coupled to four shift registers 320-0-0, 320-0-1, 320-0-2, and 320-0-3 to shift bits into the CNP 316-0.

The shift registers coupled to the CNP 316-1 are time division multiplexed using multiplexers 322-0, 322-1 and 322-2 such that at a first time shift registers 320-1-0, 320-1-1 and 320-1-2 are coupled to the CNP 316-1 and at a second time shift registers 320-2-0, 320-2-1 and 320-2-2 are coupled to the CNP 316-1. Notably, as will be illustrated in more detail below in a more complex example, multiplexed shift registers could be implemented as a single shift register, or in a RAM, by interleaving bits for different CNPs in a single shift register, or RAM.

Figure 4:
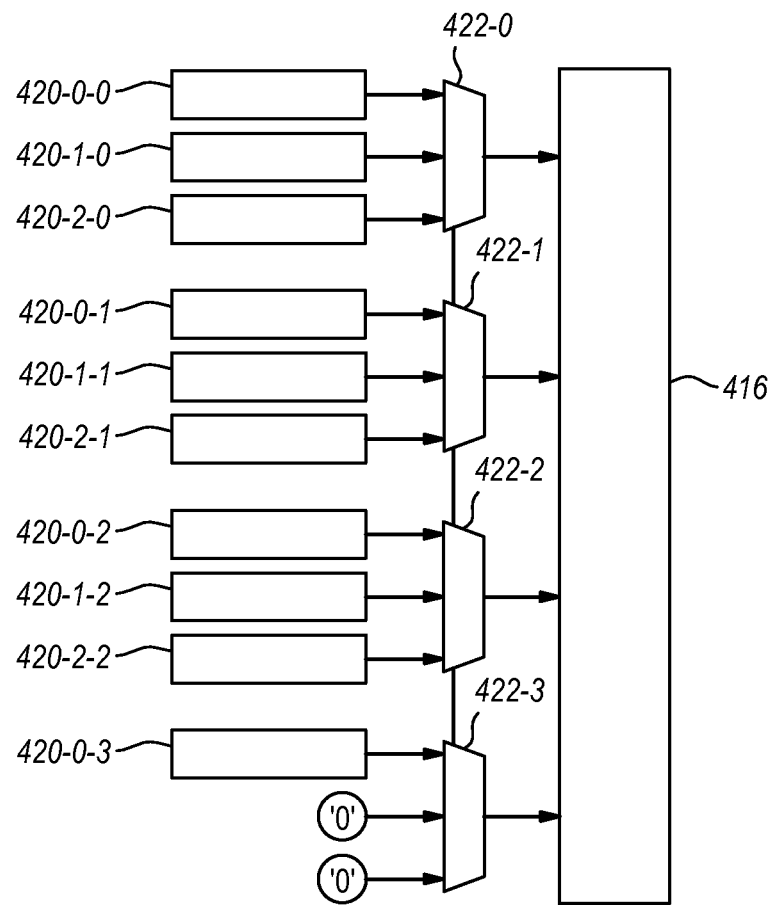
FIG. 4 illustrates another example of sharing a check node processor.

In yet another alternative embodiment, a CNP configured to implement the highest degree check node of a set of check nodes may be used to implement all check nodes in the set. Such an example is illustrated in FIG. 4. The CNP 416 may be used to implement all check nodes 116-0, 116-1 and 116-2. In the illustrated example, multiplexers 422-0, 422-1, 422-2 and 422-3 are used to cause shift registers 420-0-0, 420-0-1, 420-0-2 and 420-0-3 to be coupled to the CNP 416 at a first time, shift registers 420-1-0, 420-1-1, 420-1-2 and a fixed input of a bit with a value of '0' to be coupled to the CNP 416 at a second time, and shift registers 420-2-0, 420-2-1, 420-2-2 and a fixed input of a bit with a value of '0' to be coupled to the CNP 416 at a third time.

Figure 5:
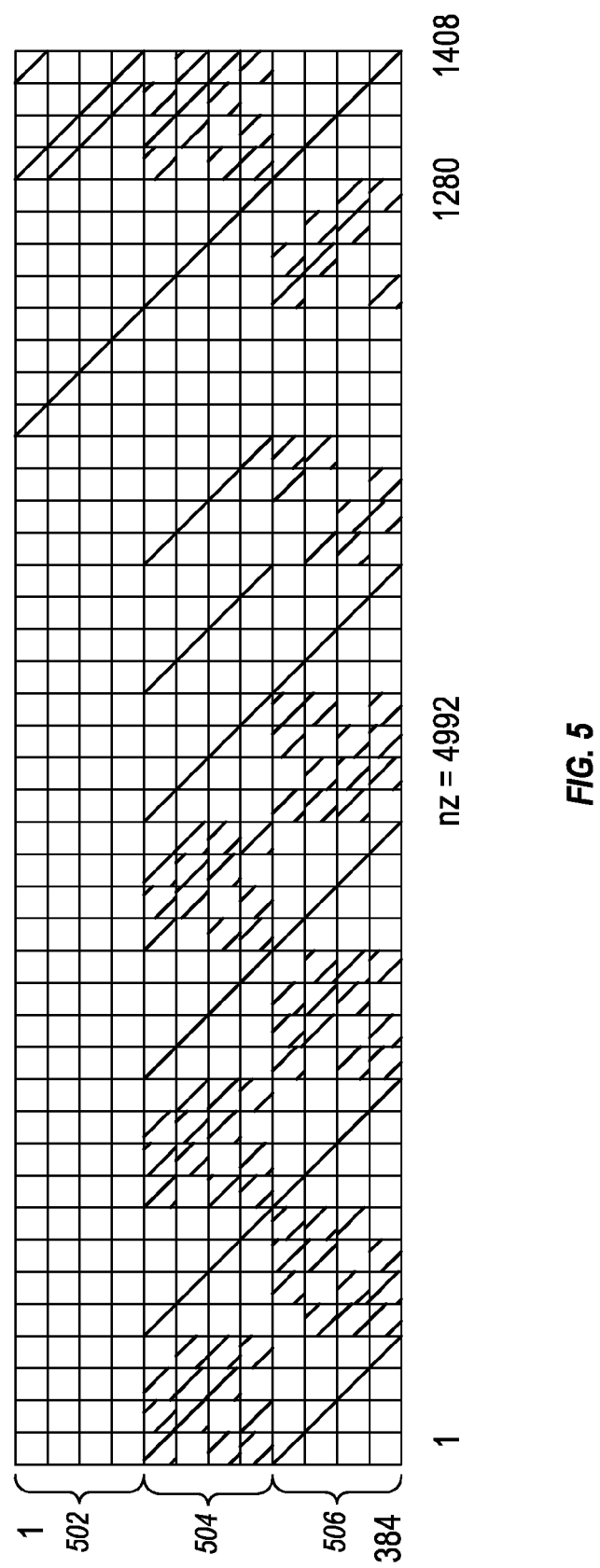
FIG. 5 illustrates a graphical form of an AR4JA (accumulate repeat 4 jagged accumulate) LDPC code.

A more complex example is now illustrated. A decoder architecture is now illustrated for the AR4JA (accumulate repeat 4 jagged accumulate) LDPC code with rate 4/5 and (unpunctured) length (1408) 1280 as illustrated in FIG. 5, but embodiments can be applied to any code where subsets of the check node processors have sufficiently similar structure that they can be time shared.

Previously, protograph decoders required as many or more check-node processors as there were major circulant rows in a parity check matrix. In the example case shown in FIG. 4, there are 12 major circulant rows grouped into three super-major rows 502, 504 and 506. In such an implementation, the architecture supports high data rates but also utilizes substantial hardware resources. Many applications may benefit from a small hardware footprint and also have relatively low data rate requirements. By time sharing CNPs, the footprint can be reduced while the data rate is also reduced.

Figure 6:
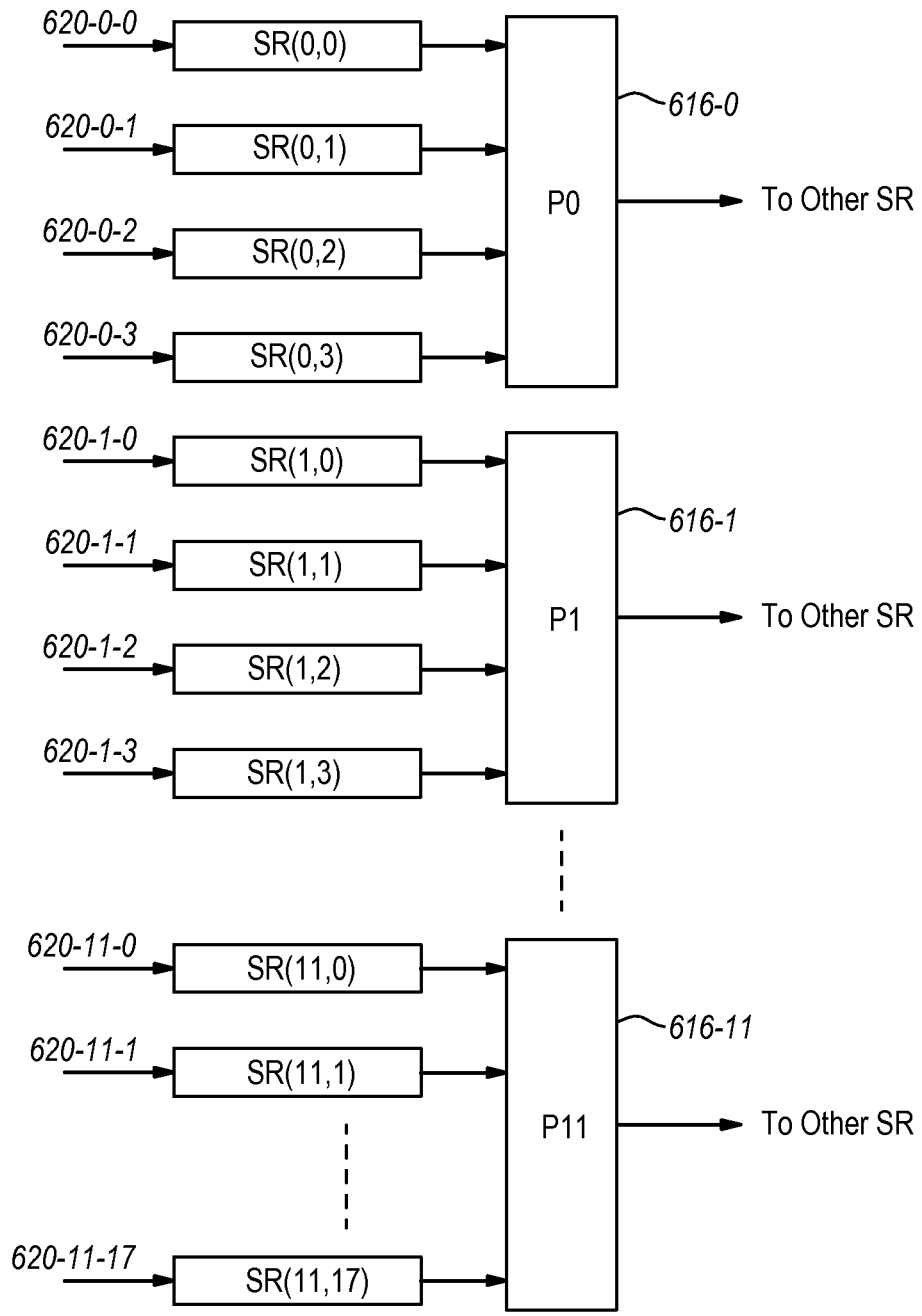
FIG. 6 illustrates a set of check node processors and associated registers.

FIG. 6 illustrates an example of a previous architecture where each of the 12 check node groups (major rows) have a dedicated CNP. In particular, FIG. 6 illustrates a CNP (P0) 616-0 to implement a fourth degree check node coupled to four shift registers 620-0-0, 620-0-1, 620-0-2, and 620-0-3; a CNP (P1) 616-1 to implement a fourth degree check node coupled to four shift registers 620-1-0, 620-1-1, 620-1-2, and 620-1-3; a set of ellipses representing nine additional CNPs and associated registers; and a CNP 616-11 (P11) representing an $18^{th}$ degree check node coupled to 18 registers 620-11-0, 620-11-1 through 620-11-17. For simplicity, only a small number of the CNPs and shift registers have been shown explicitly, but CNPs P0-P11 are included in the LDPC decoder whether explicitly or implicitly.

CNPs P0-P3 are to implement fourth degree check nodes and CNPs P4-P11 are to implement $18^{th}$ degree check nodes. Time sharing will be illustrated using examples of the fourth degree check nodes for simplicity, but the $18^{th}$ degree check nodes could be implemented in a similar fashion, but with the appropriate number of connected shift registers and inputs.

The example code illustrated in FIG. 5 is the result of a 'double lifting' from a protograph. As a result, each successive group of 4 major circulant rows has a very similar structure, i.e., the number of nonzero entries in each row. The CNPs of each of the four major rows in any of the super-major rows are functionally and structurally substantially identical. This allows time sharing a single hardware CNP for each super-major row. Thus, in some embodiments, the embodiment may be simply implemented by sharing hardware on a super-major row basis. This can be used to simplify check node grouping into same degree sets as all check nodes for a given super-major row will have the same degree. However, using this particular embodiment, there may be several different sets of check nodes that have the same degree.

Figure 7:
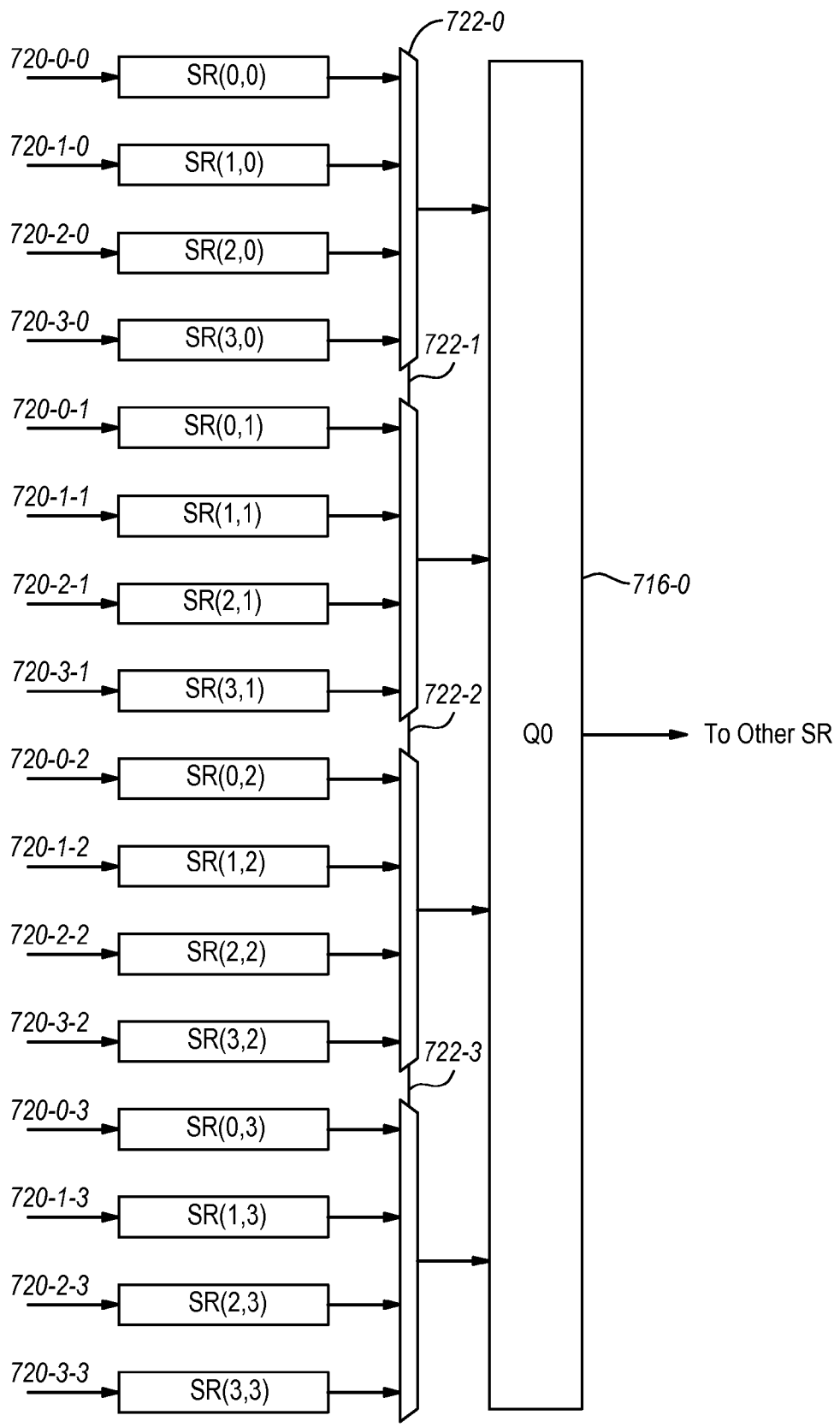
FIG. 7 illustrates sharing a check node processor.

In the present example illustrated, 2 of the 3 super-major rows (i.e., super major rows 504 and 506) have similar structure, so one processor could be shared between 8 of the 12 major rows. FIG. 7 shows the time sharing of CNP (Q0) 716-0, which is functionally and structurally identical to P0 (616-0), P1 (616-1), P2 (not shown), and P3 (not shown) in FIG. 6. In this way, P0 (616-0) to P11 (616-11) are replaced by Q0 (716-0) to Q2 (not shown). Alternatively, Q1 (not shown) could support all major rows corresponding to P4 (not shown) to P11 (116-11).

FIG. 7 illustrates the implementation of all of the fourth degree check nodes using a single CNP (Q0) 716-0. In particular, shift registers are multiplexed through multiplexers 722-0, 722-1, 722-2 and 722-3 such that registers 720-0-0, 720-0-1, 720-0-2 and 720-0-3 are coupled to the CNP 716-0 at a first time, registers 720-1-0, 720-1-1, 720-1-2 and 720-1-3 are coupled to the CNP 716-0 at a second time, registers 720-2-0, 720-2-1, 720-2-2 and 720-2-3 are coupled to the CNP 716-0 at a third time, and 720-3-0, 720-3-1, 720-3-2 and 720-3-3 are coupled to the CNP 716-0 at a fourth time.

Similar grouping could be performed for the remaining 8 check nodes; however eight different sets of registers would be multiplexed over eight different time periods. Typically, the most efficient arrangement is to time-share each CNP between the same number of check nodes.

While the example illustrated in FIG. 7 illustrates multiplexing of different shift registers, alternative embodiments could use a single larger shift register or even RAM with the appropriate values interleaved. In particular, time sharing of processors allows several shift registers (SR) to be implemented in a single block RAM.

Figure 8:
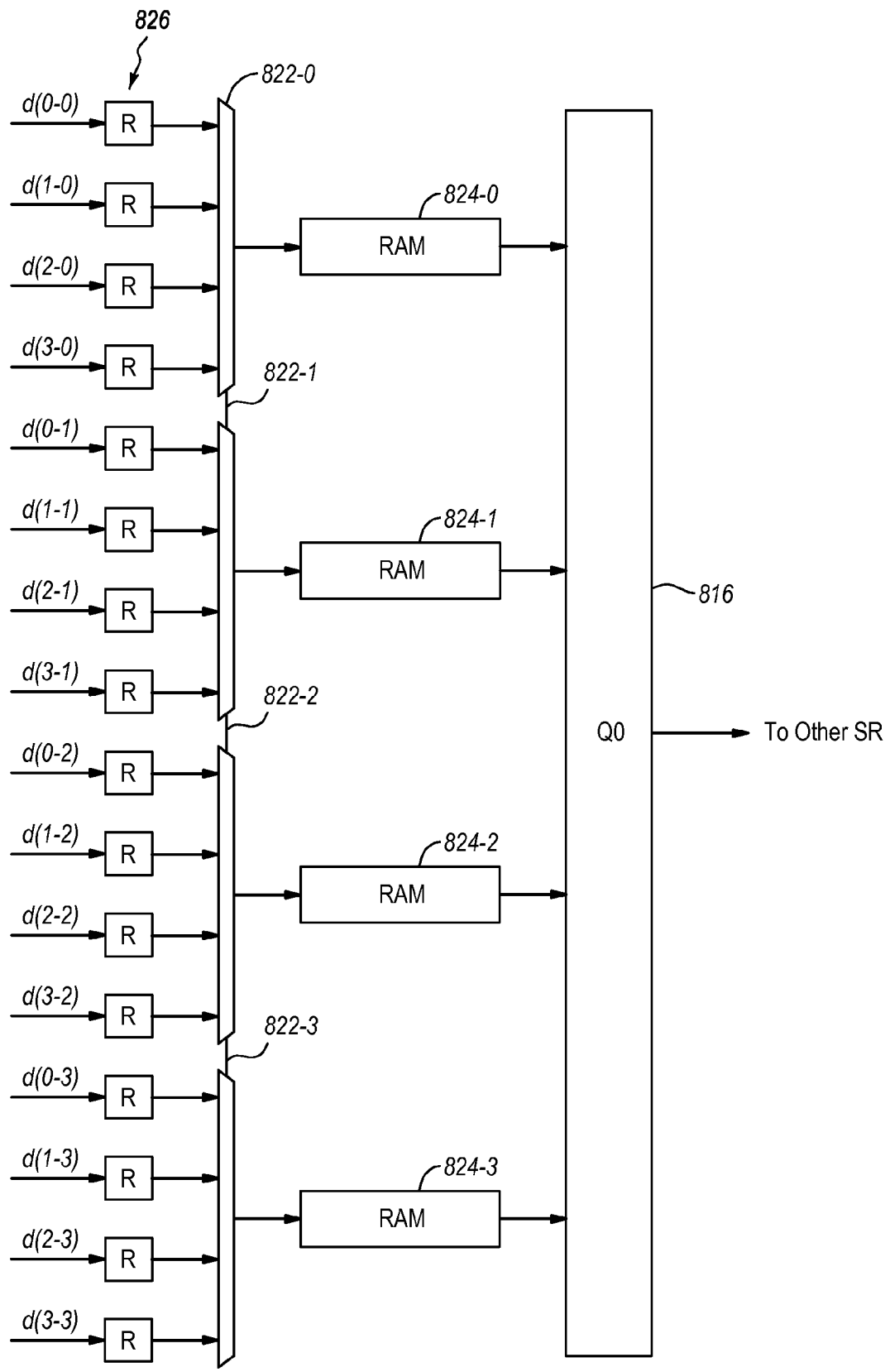
FIG. 8 illustrates sharing a check node processor and sharing memory.

FIG. 8 illustrates such an example with respect to the fourth degree check nodes and with the addition of a set 826 of registers. The registers are added because in general multiple inputs may be arriving on the same clock cycle, and the shift registers in combination with the multiplexers 822-0, 822-1, 822-3, and 822-4 can be used to interleave the values into the block RAMs 824-0, 824-1, 824-2, and 824-3. The functionality previously implemented in shift registers may be implemented in a RAM since every 4 clock cycles, 4 values will be written and 4 values will be read. Several methods allow for simple addressing of the RAM to share multiple shift registers. Thus, embodiments can time-share a larger (and cheaper per unit of storage) RAM in place of several short (and more expensive per unit of storage) shift registers thereby increasing the utilization of block RAMs. Such architecture is applicable to many LDPC codes and LDPC code families Embodiments can therefore provide scalability to protograph LDPC decoders. In some embodiments hardware size scales roughly proportionally to throughput. Thus, throughput could be throttled by appropriately selecting hardware to be shared. Thus, for example, more throttling will occur when more check nodes are implemented by a single check node processor.

In addition, the amount of throttling can be tailored. Thus, for example, if a system has four check nodes of the same degree, all four could be implemented by a single shared check node processor for maximum throttling. Alternatively, two different check node processors could each implement two check nodes for a moderate throttling (or even one check node processor could implement one check node and the other check node processor could implement three of the check nodes if more throttling is desired). Or, no throttling could be achieved by using four check node processors.

The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Figure 9:
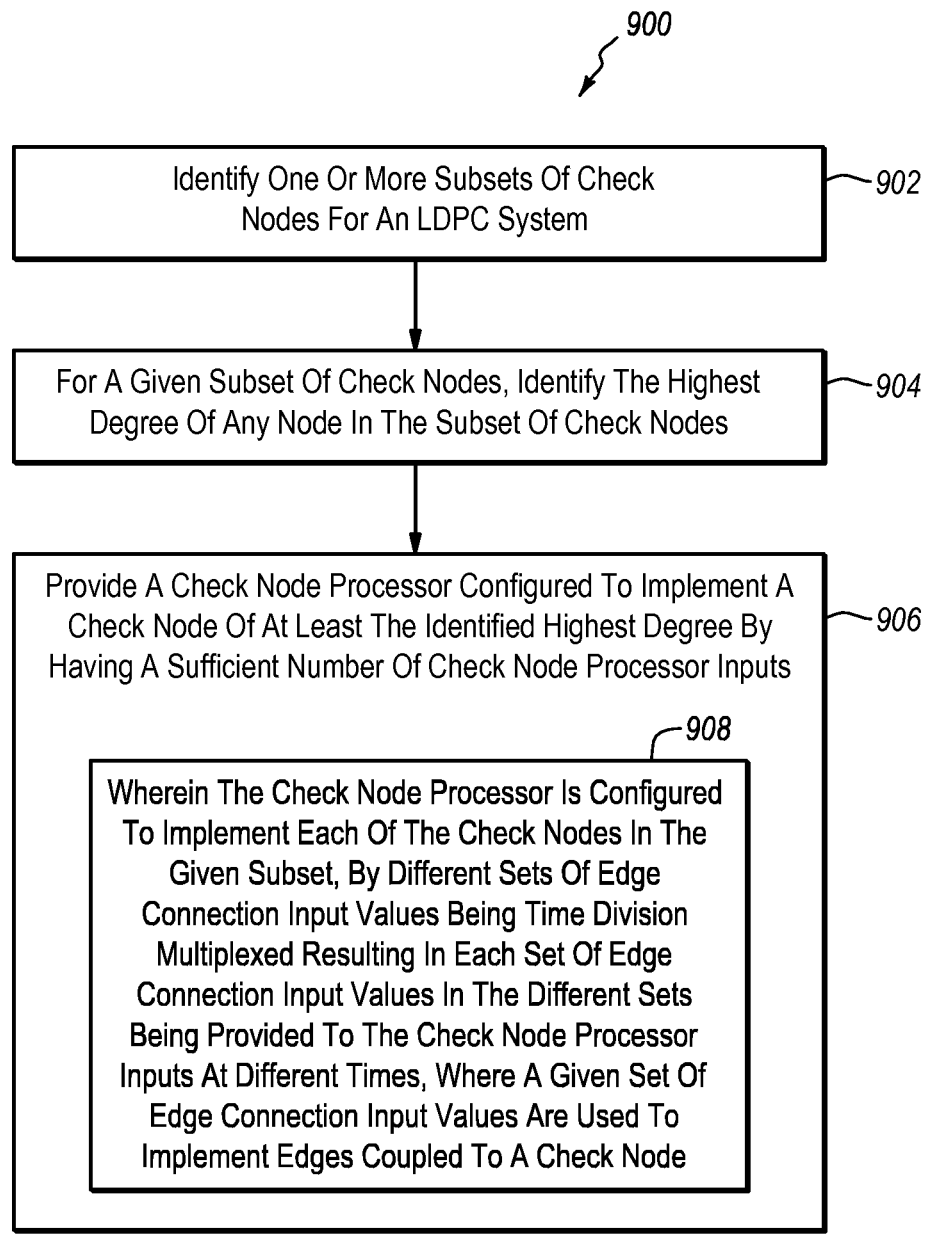
FIG. 9 illustrates a method of time-sharing LDPC decoding hardware.

Referring now to FIG. 9, a method 900 is illustrated. The method 900 includes a method for time-sharing LDPC decoding hardware. The method includes identifying one or more subsets of check nodes for an LDPC system (act 902). Each check node in the subsets of check nodes is of a particular degree. The degree of a given check node is the number of edges coupled to the given check node.

The method 900 further includes, for a given subset of check nodes, identifying the highest degree of any node in the subset of check nodes (act 904). For example, in FIG. 3, if check nodes 116-1 and 116-2 were in a subset, the highest degree would be three. Alternatively, if check nodes 116-0, 116-1 and 116-2 were all in the same subset, then the highest degree would be four.

The method 900 further includes providing a check node processor configured to implement a check node of at least the identified highest degree by having a sufficient number of check node processor inputs (act 906). Thus, for example, as illustrated in FIG. 3, the check node processor 316-1 can be provided for a subset that has a maximum degree of three. Alternatively, as illustrated in FIG. 4, the check node processor 416 can be provided when the maximum degree is four. The check node processor 416 is configured to accept four edge connection input values.

The check node processor is configured to implement each of the check nodes in the given subset, by different sets of edge connection input values being time division multiplexed, which results in each set of edge connection input values in the different sets being provided to the check node processor inputs at different times.

A given set of edge connection input values are used to implement edges coupled to a check node (see 908). For example, FIG. 4 illustrates multiplexers 422-0 through 422-3 that can be used to provide a set of edge connection input values from registers 420-0-0, 420-0-1, 420-0-2 and 420-0-3 at a first time, connection input values from registers 420-1-0, 420-1-1, and 420-1-2 at a second time, and connection input values from registers 420-2-0, 420-2-1, and 420-2-2 at a third time.

The method 900 may be performed where for any check node in the given subset of check nodes with a degree less than the highest degree, any edge connection input values in a set of edge connection input values provided to the check node processor that are not needed to implement edges to the check node is set to a predetermined value. In some embodiments, the predetermined value is a logical low value. In particular, the value should typically be a '0' to use the larger-degree CNP. Depending on a channel, the actual value corresponding to a bit '0' may change. For example, over Additive White Gaussian Noise, embodiments may use a message value of +infinity to indicate a very-high confidence '0'. In the example illustrated, because there are two check nodes implemented by the check node processor 416 that only need three edge connection input values, the multiplexer 422-3 has two of its inputs tied to a logical low value.

The method 900 may be practiced where identifying one or more subsets of check nodes comprises grouping check nodes by degree such that each subset comprises check nodes of the same degree. In some such embodiments, the method 900 further includes providing a check node processor for each subset of check nodes. Each processor is configured to implement check nodes of at least the degree of the check nodes in the subset for which the check node processor was provided. An example of this is illustrated in FIG. 3, where check node processors are provided for fourth degree check nodes (i.e. processor 316-0) and third degree check nodes (i.e. processor 316-1). In some such embodiments, grouping check nodes by degree includes grouping all check nodes for major rows of a super-major row of a doubly-lifted code into a subset.

The method 900 may further include providing a RAM for each check node processor input used to implement check nodes. Each RAM is coupled to an output of a multiplexer allowing the multiplexer to interleave edge connection input values into the RAM to provide the edge connection inputs to a check node processor input. In some such embodiments, the method 900 may further include providing a register for each input of the multiplexers to coordinate timing of edge connection input values. FIG. 8 illustrates an example where RAMs 824-0 through 824-3 and registers 826 are provided.

The method 900 may further include identifying a desired throttling effect. In some such embodiments, identifying one or more subsets of check nodes may include grouping check nodes in a way to achieve the desired throttling effect.

Figure 10:
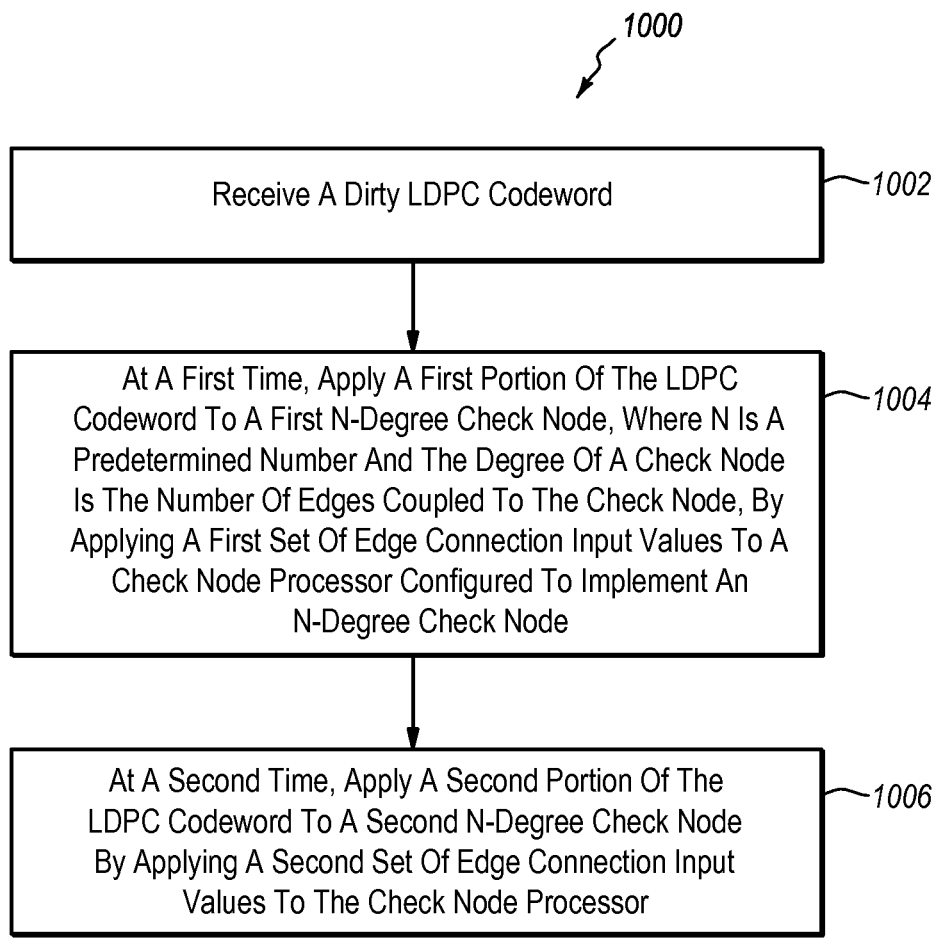
FIG. 10 illustrates a method of decoding an LDPC codeword.

Referring now to FIG. 10, a method 1000 of decoding an LDPC codeword is illustrated. The method includes receiving a noisy LDPC codeword (act 1002). For example, FIG. 1 illustrates a receiver 108 receiving a noisy code word ?01?11.

The method further includes, at a first time, applying a first portion of the LDPC codeword to a first n-degree check node, where n is a predetermined number and the degree of a check node is the number of edges coupled to the check node, by applying a first set of edge connection input values to a check node processor configured to implement an n-degree check node (act 1004). For example, as illustrated in FIG. 3, edge connection input values provided by registers 320-1-0, 320-1-1, and 320-1-2 can be provided at a first time by appropriate selection by the multiplexers 322-0, 322-1 and 322-2.

The method 1000 further includes, at a second time, applying a second portion of the LDPC codeword to a second n-degree check node by applying a second set of edge connection input values to the check node processor (act 1006). For example, as illustrated in FIG. 3, edge connection input values provided by registers 320-2-0, 320-2-1, and 320-2-2 can be provided at a second time by appropriate selection by the multiplexers 322-0, 322-1 and 322-2.

The method 1000 may be performed where the second portion of the LDPC codeword should be applied to a check node of 'k' degree, which is a degree less than n-degree. In one such example, applying the second portion of the LDPC codeword to a second n-degree check node by applying a second set of edge connection input values to the check node processor is performed where (n–k) edge connection input values are pre-determined constant values. Thus, for example, as illustrated in FIG. 4, while a fourth degree check node can be implemented by the check node processor 416, in some cases, only a third degree check node is needed, such that a constant logical low value can be provided when implementing third degree check nodes.

The method 1000 may be implemented where applying a first set of edge connection input values to a check node processor and applying a second set of edge connection input values to the check node processor is performed by applying the edge connection input values from a set of n memory devices. Each of the n memory devices interleaves an edge connection input value from the first set of edge connection input values with an edge connection input value from the second set of edge connection input values. Such an example is illustrated in FIG. 8, where edge connection input values can be interleaved into the RAMs 824-0 through 824-3.

The method 1000 may be practiced where applying a first portion of the LDPC codeword to a first n-degree check node and applying a second portion of the LDPC codeword to a second n-degree check node is performed as part of implementing all check nodes for major rows of a super-major row using a single check node processor. Thus for example, in FIG. 5, there are three super-major rows 502, 504 and 506. One check node processor each could be used to implement check nodes for the constituent major rows of these super-major rows. Notably, in the illustrated example, because of the similarities between super-major rows 504 and 506, one check node processor could be used to implement all of the major rows in both of these super-major rows.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for time-sharing LDPC decoding hardware, the method comprising:
   identifying one or more subsets of check nodes for an LDPC system wherein each check node in the subsets of check nodes is of a particular degree, where the degree of a given check node is the number of edges coupled to the given check node;
   for a given subset of check nodes, identifying the highest degree of any node in the subset of check nodes;
   providing a check node processor configured to implement a check node of at least the identified highest degree by having a sufficient number of check node processor inputs; and
   wherein the check node processor is configured to implement each of the check nodes in the given subset, by different sets of edge connection input values being time division multiplexed resulting in each set of edge connection input values in the different sets being provided to the check node processor inputs at different times, where a given set of edge connection input values are used to implement edges coupled to a check node.

2. The method of claim 1, wherein for any check node in the given subset of check nodes with a degree less than the highest degree, any edge connection input values in a set of edge connection input values provided to the check node processor that are not needed to implement edges to the check node is set to a predetermined value.

3. The method of claim 2, wherein the predetermined value is a logical low value.

4. The method of claim 1, wherein identifying one or more subsets of check nodes comprises grouping check nodes by degree such that each subset comprises check nodes of the same degree, and wherein the method further comprises providing a check node processor for each subset of check nodes, where each processor is configured to implement check nodes of at least the degree of the check nodes in the subset for which the check node processor was provided.

5. The method of claim 4, wherein grouping check nodes by degree comprises grouping all check nodes for major rows of a super-major row into a subset.

6. The method of claim 1, further comprising providing a RAM for each check node processor input used to implement check nodes, wherein each RAM is coupled to an output of a multiplexer allowing the multiplexer to interleave edge connection input values into the RAM to provide the edge connection inputs to a check node processor input.

7. The method of claim 6, further comprising providing a register for each input of the multiplexers to coordinate timing of edge connection input values.

8. The method of claim 1, further comprising, identifying a desired throttling effect, and wherein identifying one or more subsets of check nodes comprises grouping check nodes in a way to achieve the desired throttling effect.

9. An LDPC decoder, the LDPC decoder comprising:
   a check node processor, wherein the check node processor is configured to implement an n-degree check node, where n is a predetermined number and the degree of a check node is the number of edges coupled to the check node; and
   a plurality of n time division multiplexers coupled to the check node processor to couple different edge connection input values to the check node processor at different times so as to allow the check node processor to be time division multiplexed for use in implementing different check nodes with the same check node processor, each of the multiplexers configured to provide no more than one edge connection input value to the check node processor at any given time, where each edge connection is used to implement an edge into a check node.

10. The LDPC decoder of claim 9, wherein each of the multiplexers comprises m inputs, where m is a predetermined number, and wherein the inputs are configured such that the check node processor and plurality of multiplexers are used to implement m check nodes where all m check nodes are n-degree.

11. The LDPC decoder of claim 10, wherein the decoder is configured to implement the m check nodes using the check node processor based on the m check nodes being for all major rows in a super major row.

12. The LDPC decoder of claim 10, wherein the decoder is configured to implement the m check nodes using the check node processor based on the m check nodes being all check nodes of n-degree in a protograph.

13. The LDPC decoder of claim 9, wherein each of the multiplexers comprises m inputs, where m is a predetermined number, and wherein the inputs are configured such that the check node processor and plurality of multiplexers are used to implement m check nodes where all m check nodes are no more than n-degree.

14. The LDPC decoder of claim 13, wherein for any of the check nodes that are less than n-degree, a sufficient number of the multiplexers are configured with an input at a constant predetermined value for those check nodes such that only a sufficient number of multiplexers provide variable edge connection input values to implement the degree of those check nodes.

15. The LDPC decoder of claim 9, further comprising a plurality of n RAMs coupled to the check node processor with respective RAM output being coupled to one respective check node processor input, and wherein the multiplexers are coupled to the check node processor through the RAMs, and where the multiplexers are configured to interleave edge connection input values into the RAMs.

16. The LDPC decoder of claim 9, further comprising:
one or more additional check node processors;
one or more additional pluralities of time division multiplexers; and
wherein each additional check node processor is coupled to an additional plurality of time division multiplexers from the one or more additional pluralities of time division multiplexers and wherein each set of an additional check node processor and an additional plurality of time division multiplexers is configured to implement a plurality of check nodes where each of the check nodes is of no more than a particular predetermined degree for the set of the additional check processor and the additional plurality of check nodes.

17. A method of decoding an LDPC codeword, the method comprising:
receiving a noisy LDPC codeword;
at a first time, applying a first portion of the LDPC codeword to a first n-degree check node, where n is a predetermined number and the degree of a check node is a number of edges coupled to the check node, by applying a first set of edge connection input values to a check node processor configured to implement an n-degree check node; and
at a second time, applying a second portion of the LDPC codeword to a second n-degree check node by applying a second set of edge connection input values to the check node processor.

18. The method of claim 17, wherein the second portion of the LDPC codeword should be applied to a check node of k degree, which is a degree less than n-degree, and wherein applying the second portion of the LDPC codeword to a second n-degree check node by applying a second set of edge connection input values to the check node processor is performed where (n−k) edge connection input values are predetermined constant values.

19. The method of claim 17, wherein applying a first set of edge connection input values to a check node processor and applying a second set of edge connection input values to the check node processor is performed by applying the edge connection input values from a set of n memory devices, where each of the n memory devices interleaves an edge connection input value from the first set of edge connection input values with an edge connection input value from the second set of edge connection input values.

20. The method of claim 17, wherein applying a first portion of the LDPC codeword to a first n-degree check node and applying a second portion of the LDPC codeword to a second n-degree check node is performed as part of implementing all check nodes for major rows of a super-major row using a single check node processor.

* * * * *